(12) United States Patent
Hur et al.

(10) Patent No.: US 6,476,494 B1
(45) Date of Patent: Nov. 5, 2002

(54) SILVER-TIN ALLOY SOLDER BUMPS

(75) Inventors: Nam-jung Hur, Kyungki-do (KR); Yong-hwan Kwon, Kyungki-do (KR); Jong-han Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/438,727

(22) Filed: Nov. 11, 1999

Related U.S. Application Data

(62) Division of application No. 09/063,716, filed on Apr. 21, 1998, now Pat. No. 6,013,572.

(30) Foreign Application Priority Data

May 27, 1997 (KR) .............................. 97-21022

(51) Int. Cl.[7] ........................ H01L 23/488; H01L 29/41; H01L 29/43
(52) U.S. Cl. ....................... 257/762; 257/738
(58) Field of Search ................. 257/738, 762, 257/772, 778, 779, 737, 741

(56) References Cited

U.S. PATENT DOCUMENTS

| | | | | |
|---|---|---|---|---|
| 5,208,186 A | * | 5/1993 | Mathew | 257/779 |
| 5,418,186 A | | 5/1995 | Park | 438/614 |
| 5,503,286 A | * | 4/1996 | Nye et al. | 257/737 |
| 5,726,501 A | * | 3/1998 | Matsubara | 257/778 |
| 5,789,271 A | * | 8/1998 | Akram | 438/18 |
| 5,805,422 A | * | 9/1998 | Otake et al. | 257/737 |
| 5,878,943 A | * | 3/1999 | Nishikawa et al. | 228/205 |
| 5,928,404 A | | 7/1999 | Paruchuri | 75/255 |

* cited by examiner

Primary Examiner—Mary Wilczewski
(74) Attorney, Agent, or Firm—Myers Bigel Sibley & Sajovec, P.A.

(57) ABSTRACT

Silver-tin alloy solder bumps are fabricated by forming a masked underbump metallurgy layer on a microelectronic substrate, to define exposed portions of the underbump metallurgy layer, plating silver on the exposed portions of the underbump metallurgy, plating tin on the silver and reflowing to form silver-tin alloy solder bumps. Accordingly, silver-tin alloy is not plated. Rather, individual layers of silver and tin are plated, and then reflowed to form silver-tin alloy solder bumps.

11 Claims, 5 Drawing Sheets

SILVER-TIN ALLOY SOLDER BUMPS

This application is a Division of application Ser. No. 09/063,716 filed Apr. 21, 1998 now U.S. Pat. No. 6,013,572.

FIELD OF THE INVENTION

This invention relates to microelectronic packaging devices and methods, and more particularly relates to solder bumps for microelectronic substrates and methods of fabricating and testing same.

BACKGROUND OF THE INVENTION

As electronic devices continue to be miniaturized, the mounting of a microelectronic substrate to another microelectronic substrate may become increasingly difficult. Thus, high density, high performance and reliable interconnection techniques are desirable for microelectronic substrates. It will be understood by those having skill in the art that microelectronic substrates include but are not limited to integrated circuit chips, wafers, printed circuit boards, multichip module substrates, ceramic substrates, glass substrates and any other electronic packaging substrates that are used in microelectronic systems including optoelectronic systems.

In order to satisfy these requirements, solder bump technology is increasingly being used for microelectronic packaging. Solder bump technology is also referred to as C4 (controlled collapse circuit connection) or "flip chip" technology. Solder bump technology can allow a bare integrated circuit to be mounted on a next level package, without requiring encapsulation of the integrated circuit. Moreover, solder bump technology can utilize the entire area of a microelectronic substrate for connection rather than only using the periphery thereof. High performance may be obtained because high frequency signal transmission may be obtained due to direct bonding.

Conventional solder bumps generally use an alloy of lead (Pb) and another metal. Specifically, an alloy of 95% lead and 5% tin (Sn) is widely used. Unfortunately, the use of the lead may be harmful for the environment, so that alternatives to lead are being investigated. Alloys of silver (Ag) and tin (Sn) have been investigated as alternatives to lead-based alloys for solder bumps. However, since solder bumps are generally plated on an underbump metallurgy using a mask, it may be difficult to plate silver-tin alloy solder bumps as opposed to lead-tin solder bumps. Although it may be possible to use paste screening processes to form silver-tin alloy solder bumps, plating may be preferred for high-density solder bump interconnections.

SUMMARY OF THE INVENTION

It is therefore an object of the present invention to provide improved solder bump structures for microelectronic substrates and methods of fabricating and testing same.

It is another object of the present invention to provide improved silver-tin alloy solder bumps and methods of fabricating and testing same.

These and other objects are provided, according to the present invention, by forming a masked underbump metallurgy layer on a microelectronic substrate, to define exposed portions of the underbump metallurgy layer, plating silver on the exposed portions of the underbump metallurgy, plating tin on the silver and reflowing to form silver-tin alloy solder bumps. Accordingly, silver-tin alloy is not plated. Rather, individual layers of silver and tin are plated, and then reflowed to form silver-tin alloy solder bumps.

The masked underbump metallurgy layer is preferably formed by forming a continuous underbump metallurgy layer on the microelectronic substrate and forming a patterned mask layer on the continuous underbump metallurgy layer, to define the exposed portions of the underbump metallurgy layer. The patterned mask layer is preferably removed after the tin is plated and before reflowing. Moreover, the portions of the continuous underbump metallurgy layer that are not between the microelectronic substrate and the tin are also preferably removed prior to reflowing, so that reflowing can result in formation of solder bumps. In order to aid in reflowing, the silver and tin layers may be coated with flux prior to reflowing and the flux may be removed after reflowing.

When plating the tin on the silver using a mask, tin may be plated on the silver and extend onto the mask opposite the underbump metallurgy to form a mushroom shape. After removing the mask, reflowing is performed by heating at temperature and time that are sufficient to melt the tin and to diffuse at least some of the silver into the tin.

The masked underbump metallurgy layer preferably comprises a first underbump metallurgy layer on the microelectronic substrate that is selected from the group consisting of titanium (Ti), chromium (Cr) and titanium tungsten (TiW). A second underbump metallurgy layer is formed on the first underbump metallurgy layer opposite the microelectronic substrate. The second underbump metallurgy layer is preferably selected from the group consisting of copper (Cu) and nickel (Ni).

The steps of plating silver and plating tin are preferably performed by electroplating silver and electroplating tin. Silver may be electroplated at temperature between 15° C. and 30° C., at current density between 10 mA/cm$^2$ and 14 mA/cm$^2$ and time between 13 minutes and 17 minutes. Tin may be electroplated at temperature between 15° C. and 30° C., at current density between 18 mA/cm$^2$ and 22 mA/cm$^2$ and time between 35 minutes and 45 minutes. These parameters can electroplate a silver thickness between 9 μm and 11 μm and a tin thickness between 38 μm and 42 μm. Reflowing may be performed by heating at temperatures between 240° C. and 330° C. The reflow may produce silver-tin alloy solder bumps that are between 2.5% and 4.5% silver and 97.5% and 95.5% tin.

In order to test the silver-tin alloy solder bumps, silver-tin alloy solder bumps may be fabricated as described above, and then sectioned. The sectioned silver-tin alloy solder bumps are then analyzed. The solder bumps may be sectioned by mounting the sectioned solder bumps in an epoxy resin, polishing the solder bumps and etching the mounted solder bumps. They may then be analyzed by performing electron probe microanalysis on the sectioned silver-tin alloy solder bumps and/or performing scanning electron microscopy on the sectioned silver-tin alloy solder bumps.

In another testing method, first and second silver layers are plated, having corresponding first and second thicknesses, on the underbump metallurgy. Tin is then plated on the first and second silver layers. Reflowing is then performed to form first and second solder bumps of differing silver-tin alloy compositions. First and second solder bumps are then analyzed. Multiple reflowing and analyzing steps may be performed in sequence in order to analyze the composition and other parameters of the solder bumps during different reflow times.

Solder bump structures for microelectronic substrates according to the invention include an underbump metallurgy layer on the microelectronic substrate, a first layer comprising silver on the underbump metallurgy layer opposite the microelectronic substrate and a second layer comprising tin on the first layer opposite the underbump metallurgy layer. The second layer comprising tin is preferably a second layer comprising silver-tin alloy.

During intermediate fabrication, the second layer may be a mushroom-shaped second layer comprising tin. In the final solder bump structure, the second layer is preferably a truncated spherical-shaped second layer comprising tin, and preferably comprising silver-tin alloy. A flux coating may be included during intermediate fabrication. The underbump metallurgy may be a two-layer structure as already described, and the thicknesses and compositions of the first and second layers and the silver-tin alloy may be as already described. Accordingly, high performance solder bump structures and fabrication and testing methods may be provided, that need not be detrimental to the environment.

DETAILED DESCRIPTION OF PREFERRED EMBODIMENTS

Figure 1:
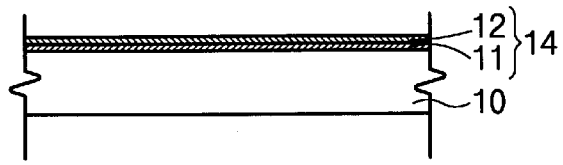
FIGS. 1–10 are cross-sectional views illustrating methods of fabricating solder bumps for microelectronic substrates according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present.

Figure 2:
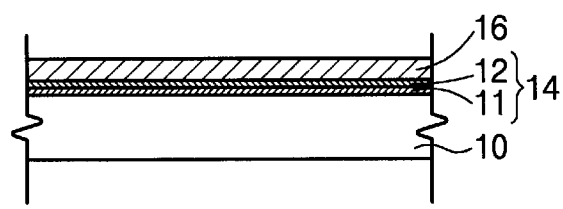
Figure 3:
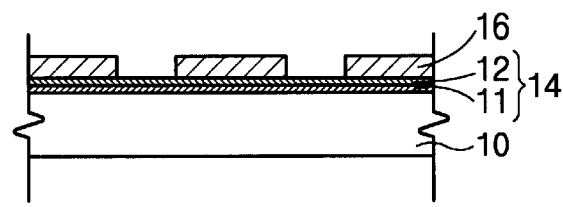

Referring now to FIGS. 1–10, methods of fabricating solder bumps for microelectronic substrates according to the invention will now be described. FIGS. 1–3 illustrate the step of forming a masked underbump metallurgy layer on a microelectronic substrate, the masked underbump metallurgy layer defining exposed portions of the underbump metallurgy layer. More particularly, as shown in FIG. 1, a continuous underbump metallurgy layer (UBM) 14 is formed on a microelectronic substrate 10. It will be understood by those having skill in the art that microelectronic substrate 10 includes but is not limited to integrated circuit chips, wafers, printed circuit boards, multi-chip module substrates, ceramic substrates, glass substrates and any other electronic packaging substrates that are used in microelectronic systems, including optoelectronic systems such as liquid crystal devices and lasers.

As shown in FIG. 1, UBM layer 14 may be fabricated by forming a first UBM layer 11 on a microelectronic substrate 10 and forming a second UBM layer 12 on the first UBM layer 11 opposite the microelectronic substrate 10. It will also be understood that pads or other regions may be included on the microelectronic substrate 10 between the substrate 10 and the first UBM layer 11. The first UBM layer 11 is preferably selected from the group consisting of titanium (Ti), chromium (Cr) and titanium tungsten (TiW), and the second UBM layer 12 is preferably selected from the group consisting of copper (Cu) and nickel (Ni). Preferred combinations include Ti and Cu, Cr and Cu, Cr and Ni, TiW and Cu or TiW and Ni for the first and second underbump metallurgy layers 11 and 12 respectively. In one preferred embodiment, a Ti film 11 has a thickness between 8000 Å and 12000 Å and a Cu film has a thickness of 4000 Å to 6000 Å. For example, the Ti film may have a thickness of 1000 Å and the Cu film may have a thickness of 5000 Å. The first and second UBM layers 11 and 12 may be formed by sputtering. The formation of a UBM layer is well known to those having skill in the art and need not be described further herein.

Referring now to FIG. 2, 18 $\mu$m to 20 $\mu$m of photoresist 16 is deposited. For example, 19 $\mu$m of photoresist 16 may be deposited. As shown in FIG. 3, photoresist layer 16 is then patterned, to thereby form a patterned mask layer on the continuous underbump metallurgy layer that defines exposed portions of the underbump metallurgy layer. The formation and patterning of photoresist is well known to those having skill in the art and need not be described further herein.

Figure 4:
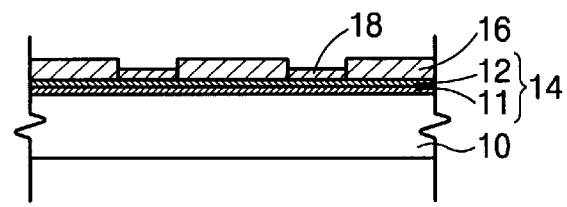
Figure 5:
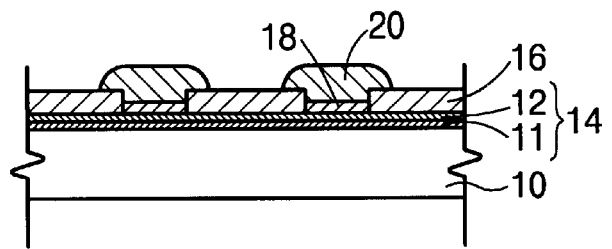

Referring now to FIG. 4, silver 18 is plated on the exposed portions of the UBM. Then, as shown in FIG. 5, tin 20 is plated on the silver. The plating of silver 18 and tin 20 is performed separately. A plating solution having common species may be used. More specifically, the plating of silver 18 may be performed using electroplating at temperature between 15° and 30° C. for 13 minutes to 17 minutes using 10 mA/cm$^2$ to 14 mA/cm$^2$ current density. In one embodiment, silver may be plated at 25° C., a current density of 12 mA/cm$^2$ and a time of 15 minutes. This can form in a layer of silver 18 that is between 9 $\mu$m and 11 $\mu$m thick, for example 10 $\mu$m thick.

Tin 20 is then plated over the silver 18 using electroplating at temperature between 15° C. and 30° C. for 35 minutes to 45 minutes at 18 mA/cm$^2$ and 22 mA/cm$^2$ current density. In one embodiment, silver may be plated at 25° C. for 40 minutes at current density of 20 mA/cm$^2$. This can produce a thickness of tin layer 20 of between 38 $\mu$m and 42 $\mu$m. For example, a 40 $\mu$m thick layer 20 may be provided as shown in FIG. 5, by plating a layer of tin that is thicker than the mask layer 16. The tin layer extends onto the mask opposite the underbump metallurgy to form a mushroom shape.

Figure 6:
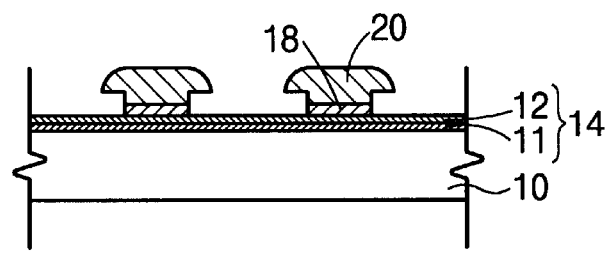

Referring now to FIG. 6, the photoresist 16 is removed. The photoresist may be removed by performing a first removal using acetone, a second removal using isopropyl alcohol, and a third removal using quick drop rinse (QDR). This three-step removal process may be used to reduce damage to the UBM, the tin layer and the silver layer.

More specifically, the first removal may be performed for 270 seconds to 330 seconds for two or three times, the second removal may be carried out for 270 seconds to 330 seconds, and the third removal may be carried out for 14 minutes to 16 minutes, repeated eight to twelve times. The removal processes may be performed at temperature between 15° C. and 30° C. In a particular embodiment, removal of photoresist 16 is carried out at 25° C. using a first removal with acetone for 300 seconds repeated twice, a second removal using isopropyl alcohol for 300 seconds and a third removal using QDR for 15 minutes repeated ten times.

Figure 7:
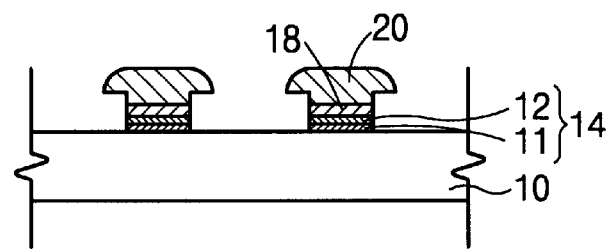

Referring now to FIG. 7, the exposed UBM (the UBM that is not between the tin layer 18 and the substrate 10) is then removed. The exposed UBM 14 may be removed by sequential first and second etches. The first etch may use a first etching solution comprising sulfuric acid ($H_2So_4$), hydrogen peroxide ($H_2O_2$) and deionized water. The second etch may use a second etching solution comprising hydrofluoric acid (HF) and deionized water.

More particularly, the first etch may be carried out using the first etching solution comprising a mixture of sulfuric acid, hydrogen peroxide and deionized water at the following ratios: 1.5 to 1.6:5.0 to 6.0:90.0 to 95.0, at temperature of 15° C. to 30° for 35 seconds to 45 seconds. The second etch may be carried out using a mixture of hydrofluoric acid and deionized water at a ratio of 1:290 to 310 at temperatures of 15° C. to 30° C. for 110 seconds to 130 seconds. In a particular embodiment, a first etching solution comprising a mixture of 15 ml of sulfuric acid, 55 ml of peroxide and 930 ml of deionized water is used at a temperature of 25° C. for 40 seconds. The second etching is carried out using second etching solution comprising sulfuric acid and deionized water mixed at a rate of 1 to 300 at a temperature of 25° C. for a 120 seconds. Thus, the compound UBM is etched by performing first and second etches.

Figure 8:
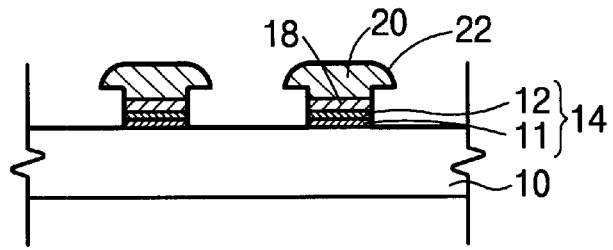
Figure 9:
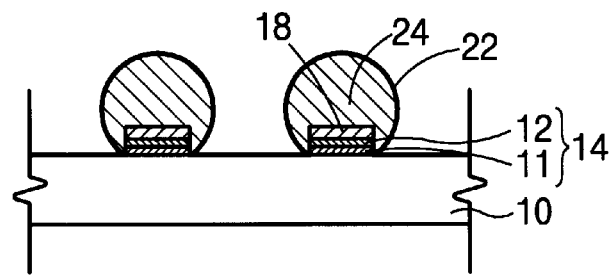

Referring now to FIG. 8, the silver and tin layers 18 and 20 respectively are optionally coated with flux 22. The microelectronic substrate 11 may also be coated with flux. Then, as shown in FIG. 9, a reflow is performed, to thereby form solder bump 24. Solder bump 24 is formed by mixing silver 18 and tin 20 at a certain rate. Surface tension of the tin 20 causes the solder bump to form in a ball (truncated hemisphere). The reflow of FIG. 9 may be performed at temperature of 240° C. to 260° C. for 240 seconds to 330 seconds. For example, it may be carried out a temperature of 250° C. for 300 seconds.

The solder bump 24 therefore is formed with a silver-tin alloy including 2.5% to 4.5% silver and 97.5% to 95.5% tin. In one preferred embodiment, the alloy includes 3.5% silver and 96.5% tin.

During the reflow process, alloying takes place between the silver and tin. In particular, by using material migration that occurs at the interface of the materials during melting, a particular alloy composition may be obtained. When the reflow is carried out at over 221° C., the silver exists in a sold state and the tin exists in a liquid state. The tin therefore melts to a liquid phase and the silver that contacts the tin in the liquid phase is diffused into the tin, thereby forming the silver-tin alloy. Thus, the amount of silver that diffuses into the tin may be a function of reflow temperature, time, the thickness of the silver and tin layers and other parameters.

Figure 10:
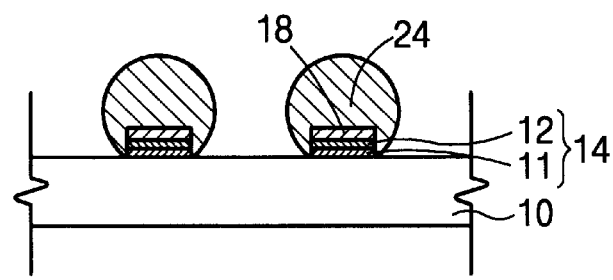

Referring now to FIG. 10, the flux 22 is removed to complete the solder bump structure. It will be understood that the fluxing and flux removal steps need not performed as part of the reflow process. Rather, fluxless reflow processes may be employed.

Figure 11:
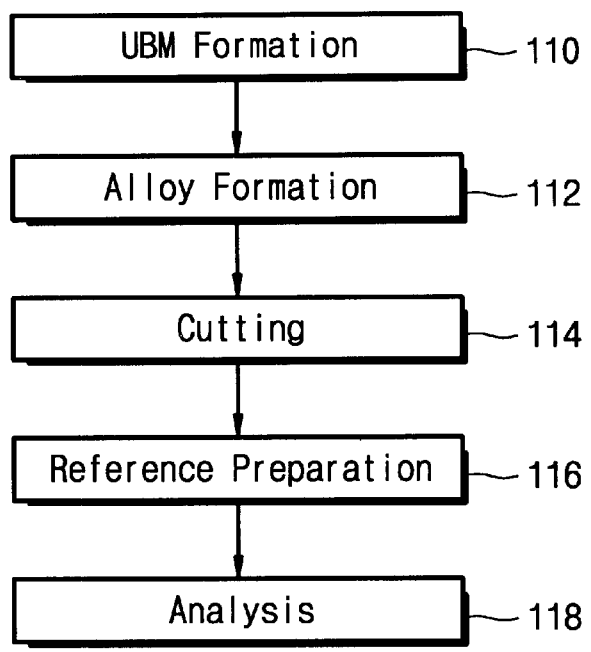
FIGS. 11 and 12 are flow diagrams illustrating methods of analyzing solder bumps according to the present invention.

Referring now to FIG. 11, methods of fabricating and analyzing solder bumps according to the present invention will now be described. As shown in FIG. 11, an underbump metallurgy is formed (Block 110) as was described in connection with FIGS. 1–3. Then, at Block 112, silver-tin alloy solder bumps are formed as was described in connection with FIGS. 4–10.

Then, referring to Block 114, the solder bump 24 is sectioned or cut. A reference is prepared at Block 116 by mounting the sectioned solder bumps in epoxy resin, polishing the mounted solder bumps and etching the mounted solder bumps. Etching may be performed using an etching solution of mixed hydrochloric acid, nitric acid and methanol.

Then, referring to Block 118, quantitative analysis may be carried out using electron probe microanalysis (EPM) and fine structure analysis may be carried out using scanning electron microscopy (SEM) for 5 minutes to 40 minutes. In quantitative analysis using EPM, it can be seen that regardless of the time of the reflow process, the mixing rate of the silver in the alloy may change very little. In the fine structure analysis using SEM, it can be seen that the surface structure may change based on the reflow process time, but the mixing rate may still be independent of the reflow time.

Figure 12:
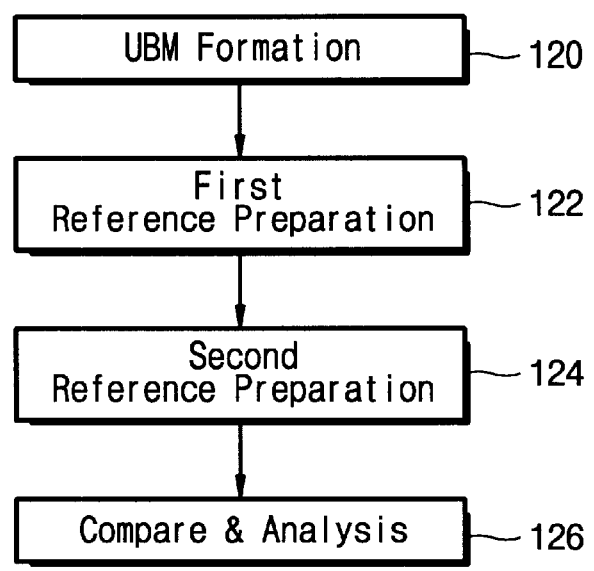

FIG. 12 is a flow diagram of other methods for analyzing solder bumps according to the present invention. These tests may analyze the thickness change and shear force of solder bumps formed according to the present invention. As shown in FIG. 12, the UBM is formed at Block 120 corresponding to FIGS. 1–3. A first reference is prepared at Block 122 by performing the steps of FIGS. 4–10 using a first thickness of silver, and a second reference is prepared at Block 124 by performing the steps of FIGS. 4–10 using a second thickness of silver.

More specifically, the first reference is prepared at Block 122 by planting a silver layer 18 of thickness between 4.3 $\mu$m and 4.7 $\mu$m. Tin is then plated thereon. To form the second reference at Block 124, silver is plated at a thickness of between 9.5 $\mu$m and 10.5 $\mu$m and tin is plated thereon. In a particular embodiment, the first reference may use 4.5 $\mu$m of silver and the second reference may use 10 $\mu$m of silver.

Reflow is then performed on the first reference and the second reference. The silver and tin of the first reference and the second reference are thereby mixed at a certain rate, and can thereby be compared and analyzed at Block 126. The reflow process may be performed six to ten times.

Figure 13:
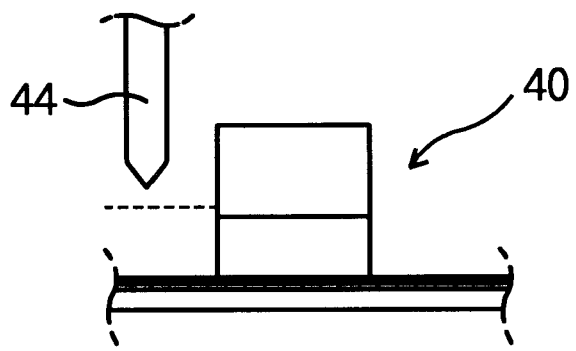
FIGS. 13 and 14 schematically represent the comparison and analysis step of FIG. 12.
Figure 14:
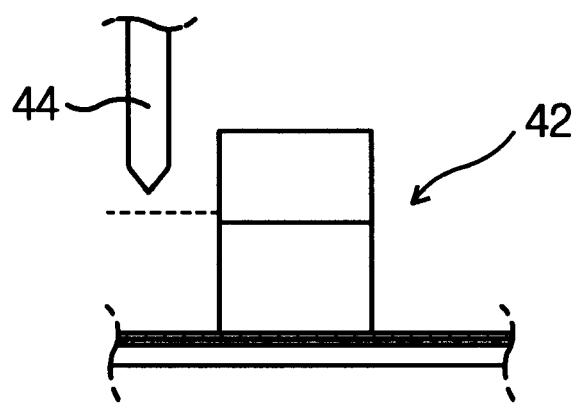

Shear forces may be measured according to the present invention using a Ball Shear Tester (BST) 44, as shown in FIGS. 13 and 14. The first reference 40 is measured at a height of 4.9 $\mu$m to 5.1 $\mu$m. The second reference 42 is measured at a height of 12.3 $\mu$m to 12.71 $\mu$m. In a particular embodiment, the measurement height of the first reference 40 is 5 $\mu$m and the measurement height of the second reference 42 is 12.5 $\mu$m. In shear force testing, the underbump metallurgy is torn from the first reference 40 after about 5 minutes and the underbump metallurgy is torn from the second reference after about 40 minutes. Accordingly, for maximum strength, 10 $\mu$m of silver may used and reflow may be carried out for 5 minutes.

In order to analyze the thickness change of the silver and the shear force according to the present invention, analysis of the second reference 42 may be carried out at temperatures of 140° C. to 160° C. for nine days. In particular, the second reference 42 may be analyzed at 150° C. for nine days. Based on this analysis, thickness change may not be detected and change in the shear force may also not be detected. Thus, the second reference 42 may have a stable structure even if left for a long time at temperatures of 160° C., so that solder bumps of the present invention can have stable structures.

In summary, a preferred embodiment of the present invention will now be described. Referring back to FIG. 1, UBM 14 of a titanium layer 11 and copper layer 12 are formed on a substrate that may include pads or other patterns formed thereon. The UBM 14 is formed by sputtering. The titanium layer 11 has a thickness of 1000 Å, and copper layer 12 has a thickness of 5000 Å. The UBM 14 should preferably have a strong adhesiveness to the substrate and should be able to withstand damage during subsequent processing. The UBM functions as a conductive plating electrode during formation of the solder bumps.

Referring back to FIG. 2, 19 μm of photoresist 16 is deposited on the UBM 14 and photolithographically patterned, as shown in FIG. 3. The size and positions of the exposed areas of the UBM may be determined based on the mounting needs for the solder bumps. Referring back to FIG. 4, silver 18 is electroplated at a temperature of 25° C., 12 mA/cm² current density for 15 minutes, to form 10 μm of silver. Referring to FIG. 5, tin 20 is plated on the silver using electroplating at a temperature of 25° C., 20 mA/cm² current density for 40 minutes, to thereby form 40 μm of tin 20. The photoresist 16 is then removed (FIG. 5). Photoresist removal is carried out at temperatures of 25° C. because conventional removal methods may affect the copper UBM layer 12. Thus, the photoresist is removed at 25° C. using acetone for 300 seconds and repeated twice. The acetone remains stable in reaction with the photoresist 16, but may leave organic compounds on the substrate. Accordingly, a subsequent treatment using isopropyl alcohol is carried out for 300 seconds in order to remove organic compounds. Then, the photoresist is removed using QDR ten times for 15 minutes.

Referring back to FIG. 7, the UBM 14 that is exposed by removal of the photoresist 16 is etched. The etch process comprises a first etch to etch the copper layer 12, and a second etch to etch the titanium layer 11. The first etch is carried out at a temperature of 25° C. for 40 seconds using a first etch solution comprising 15 ml sulfuric acid, 55 ml of hydrogen peroxide and 930 ml of deionized water. The second etch is carried out at temperatures of 25° for 120 seconds using a second etching solution comprising hydrogen fluoride, that is mixed at a rate of 1:300.

Referring back to FIG. 8, flux 22 is coated on the substrate 10 including on the silver layer 18 and tin layer 20. The flux coating can reduce or prevent oxidation on the plated regions. Then, referring back to FIG. 9, reflow is carried out 250° C. for 300 seconds in order to form solder bump 24 by alloying the silver 18 and the tin 20. The tin 20 is turned into liquid by the reflow process. The silver layer 18 is retained in solid state, and material migration occurs at the interface of the tin layer 20 and the silver layer 18. Accordingly, some of the silver migrates into the tin layer and a solder bump comprising silver-tin alloy is formed. The solder bump 24 has a composition of 3.5% silver and 96.5% tin. The reflow process may also be carried out using a nitrogen oven at about 270° C. The flux is then removed in FIG. 10. The thickness of the silver layer 18, the tin layer 20, the temperature of the reflow process and the processing time may be determined by analysis.

Thus, solder bump 24 is formed by material migration at the interface of two separately plated layers of silver and tin. Lead need not be used. High performance, high density solder bumps may thereby be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A solder bump structure for a microelectronic substrate, comprising:

an underbump metallurgy layer on the microelectronic substrate;

a first layer comprising silver on the underbump metallurgy layer, opposite the microelectronic substrate, wherein the first layer is between 9 μm and 11 μm thick; and a second layer comprising tin on the first layer, opposite the underbump metallurgy layer, wherein the second layer is between 38 μm and 42 μm thick.

2. A solder bump structure according to claim 1 wherein the second layer is a mushroom-shaped second layer comprising tin.

3. A solder bump structure according to claim 1 wherein the second layer is a truncated spherical-shaped second layer comprising tin.

4. A solder bump structure according to claim 1 further comprising:

a flux coating on the first and second layers.

5. A solder bump structure according to claim 1 wherein the underbump metallurgy layer comprises:

a first underbump metallurgy layer on the microelectronic substrate, the first underbump metallurgy layer selected from the group consisting of titanium, chromium and titanium tungsten; and a second underbump metallurgy layer on the first underbump metallurgy layer opposite the microelectronic substrate, the second underbump metallurgy layer selected from the group consisting of copper and nickel.

6. A solder bump structure according to claim 1 wherein the first layer consists essentially of silver, and wherein the second layer consists essentially of tin.

7. A solder bump structure for a microelectronic substrate, comprising:

an underbump metallurgy layer on the microelectronic substrate;

a first layer consisting essentially of silver on the underbump metallurgy layer, opposite the microelectronic substrate, wherein the first layer is between 9 μm and 11 μm thick; and a second layer consisting essentially of tin on the first layer, opposite the underbump metallurgy layer, wherein the second layer is between 38 μm and 42 μm thick.

8. A solder bump structure according to claim 7 wherein the second layer is a mushroom-shaped second layer.

9. A solder bump structure according to claim 7 wherein the second layer is a truncated spherical-shaped second layer.

10. A solder bump structure according to claim 7 further comprising:

a flux coating on the first and the second layers.

11. A solder bump structure according to claim 7 wherein the underbump metallurgy layer comprises:

a first underbump metallurgy layer on the microelectronic substrate, the first underbump metallurgy layer selected from the group consisting of titanium, chromium and titanium tungsten; and a second underbump metallurgy layer on the first underbump metallurgy layer opposite the microelectronic substrate, the second underbump metallurgy layer selected from the group consisting of copper and nickel.

* * * * *